(12) United States Patent
Kataoka et al.

(10) Patent No.: US 7,135,386 B2
(45) Date of Patent: *Nov. 14, 2006

(54) PROCESS FOR FABRICATING A SEMICONDUCTOR DEVICE

(75) Inventors: Kotaro Kataoka, Tenri (JP); Hiroshi Iwata, Nara (JP); Masayuki Nakano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/394,024

(22) Filed: Mar. 24, 2003

(65) Prior Publication Data

US 2003/0170967 A1    Sep. 11, 2003

Related U.S. Application Data

(62) Division of application No. 09/202,714, filed as application No. PCT/JP98/01892 on Apr. 23, 1998, now Pat. No. 6,562,699.

(30) Foreign Application Priority Data

Apr. 25, 1997 (JP) .................................. 9-108671

(51) Int. Cl.
    *H01L 21/322*  (2006.01)
(52) U.S. Cl. ................ 438/471; 438/583; 257/E21.318
(58) Field of Classification Search ................ 438/471, 438/476, 581, 583, 649, 659, 58, 143, 310, 438/402, 438, FOR. 144, FOR. 146, FOR. 114; 257/E21.318, E21.321, 754–758, 913
See application file for complete search history.

(56) References Cited

U.S. PATENT DOCUMENTS

| | | | |
|---|---|---|---|
| 3,601,666 A * | 8/1971 | Leedy et al. ................. 257/763 |
| 4,629,611 A | 12/1986 | Fan | |
| 4,690,730 A * | 9/1987 | Tang et al. .................. 438/649 |
| 4,851,358 A * | 7/1989 | Huber ......................... 438/471 |
| 4,981,550 A * | 1/1991 | Huttemann et al. ......... 438/672 |
| 4,981,816 A * | 1/1991 | Kim et al. ................... 438/648 |
| 5,084,417 A * | 1/1992 | Joshi et al. ................. 438/653 |
| 5,202,579 A * | 4/1993 | Fujii et al. ................... 257/751 |
| 5,726,096 A | 3/1998 | Jung | |
| 5,766,965 A * | 6/1998 | Yoshitomi et al. .......... 438/228 |
| 5,830,802 A | 11/1998 | Tseng et al. | |
| 5,831,335 A * | 11/1998 | Miyamoto ................... 257/757 |
| 5,963,828 A * | 10/1999 | Allman et al. .............. 438/648 |
| 5,972,790 A | 10/1999 | Arena et al. | |

(Continued)

FOREIGN PATENT DOCUMENTS

JP    61-258434    11/1986

(Continued)

OTHER PUBLICATIONS

Kotaki et al., "Novel Contamination Restrained Silicidation Processing . . ." Technical Digest of the International Electron Devices Meeting, XP000624754, pp. 457-460, Dec. 10, 1995.

(Continued)

*Primary Examiner*—Brook Kebede
(74) *Attorney, Agent, or Firm*—Birch, Stewart, Kolasch, and Birch, LLP

(57) ABSTRACT

By removing halogen atoms existing on the surface of the silicon layer and in the subsurface thereof so that the concentration of halogen atoms becomes 100 ppm or lower and forming an electrode on the resulting silicon layer, the electrode which has a low resistance can be produced, and a highly reliable semiconductor device can be produces as well.

15 Claims, 12 Drawing Sheets

U.S. PATENT DOCUMENTS

| | | |
|---|---|---|
| 5,998,284 A | 12/1999 | Azuma |
| 6,008,124 A | 12/1999 | Sekiguchi et al. |
| 6,121,137 A | 9/2000 | Saito |
| 6,207,562 B1 | 3/2001 | Han |
| 6,562,699 B1 * | 5/2003 | Kataoka et al. ............. 438/471 |

FOREIGN PATENT DOCUMENTS

| | | |
|---|---|---|
| JP | 8-115890 | 5/1996 |
| JP | 8-250463 | 9/1996 |
| JP | 62-094937 | 5/1997 |
| WO | WO 97/05298 | 2/1997 |

OTHER PUBLICATIONS

Kotaki et al., "Novel Ultra-Clean Self Aligned Silicide (Salicide) Technology Using Double Titanium Deposited Silicide (DTD) Process for 0.1 mm Gate Electrode", Jpan J. Applied Physics, vol. 37 pp. 1174-1178 (1998).

* cited by examiner

GATE WIDTH (μm)

▲ CONVENTIONAL EXAMPLE
● EXAMPLE

PROCESS FOR FABRICATING A SEMICONDUCTOR DEVICE

This application is a divisional of application Ser. No. 09/202,714, filed on Dec. 21, 1998 now U.S. Pat. No. 6,562,699 and for which priority is claimed under 35 U.S.C. § 120. application Ser. No. 09/202,714 is the national phase of PCT International Application No. PCT/JP98/01892 filed on Apr. 23, 1998 under 35 U.S.C. § 371.The entire contents of each of the above-identified applications are hereby incorporated by reference. This application also claims priority of Application No. 9-108671 filed in Japan on Apr. 25, 1997 under 35 U.S.C. § 119.

FIELD OF THE INVENTION

The present invention relates to a process for fabricating a semiconductor device. In particular, it relates to a process for fabricating a semiconductor device wherein contaminants existing on a surface of a silicon layer and in an subsurface thereof are removed effectively before the formation of an electrode on the silicon layer, whereby the electrode having a low resistance, high heat resistance and uniform thickness can be formed.

RELATED ART

A gate electrode of an N-type field-effect transistor is conventionally formed by the below-described process using a salicide technique.

First, as shown in FIG. 7(a), a polysilicon film is deposited on a silicon substrate 301 on which a p-well region 302, a field oxide film 303 and a gate oxide film 304 have been formed, and the polysilicon film is patterned by a reactive ion etching (RIE) method with an etching gas containing a halogen using an etching mask 306 to form a gate electrode 305.

Then, as shown in FIG. 7(b), impurity ions are implanted to be contained in a low concentration in the resulting silicon substrate 301 with intervention of a protective film 307 of silicon oxide against ion implantation to form an LDD (Lightly Doped Drain) region 308.

Subsequently, as shown in FIG. 7(c), a silicon oxide film 309 is deposited on the entire surface of the resulting silicon substrate 301 and as shown in FIG. 7(d), the silicon oxide film 309 is etched back by the RIE method to form a sidewall spacer 310.

Next, as shown in FIG. 7(e), an ion implantation is performed again via a protective film 312 against ion implantation, followed by thermal treatment, to form a source/drain region 313.

Then, as shown in FIG. 7(f), the protective film 312 against ion implantation is removed, and then a titanium film 314 is deposited, followed by thermal treatment by an RTA (Rapid Thermal Annealing) method under nitrogen atmosphere to react the titanium film 314 with silicon 301 and 305 to form a titanium silicide film 315.

Thereafter, as shown in FIG. 7(g), an unreacted titanium film and a titanium nitride film formed on the surface are selectively removed using a mixture solution of sulfuric acid and aqueous hydrogen peroxide to form titanium silicide electrodes on the source/drain region 308 and the gate electrode 305 in self-alignment.

In such a conventional process for forming an electrode as described above, there are problems in that a spontaneous oxide film may form on the silicon substrate after etching, ion implantation, thermal treatment or the like and in that the layers may be damaged by etching.

Further, in the process shown in FIG. 7(d), for example, since the uniformity in thickness, the etching rate and the like of the oxide film 309 may vary, the oxide film 309 is over-etched by about 10 to 30% of the thickness thereof. Therefore, it is also a problem that the surface of the silicon substrate is directly exposed to a halogen-containing etching gas, for example, such as $CHF_3$, $CF_4$ or the like, and thereby that the surface of the silicon substrate is contaminated by halogen atoms in the etching gas.

Under these circumstances, for example, Japanese Unexamined Patent Publication No. Hei 8-115890 proposes a method for removing the spontaneous oxide film by depositing a metal layer, subjecting to thermal treatment to form a silicide layer and removing the silicide layer. Further, Japanese Unexamined Patent Publications Nos. Sho 62-94937 and Hei 8-250463 propose methods for removing the damaged-by-etching layer by forming an oxide film using a sputtering method or by sacrificial oxidation and removing the oxide film.

Further, against the contamination of the surface of the substrate, utilized is an ashing treatment or a washing treatment of the surface of the substrate with an acid or alkaline solution such as a mixture solution of sulfuric acid and aqueous hydrogen peroxide, a mixture solution of hydrochloric acid and aqueous hydrogen peroxide, a mixture solution of ammonia and aqueous hydrogen peroxide or the like.

However, in these methods, since the surface layer on the silicon substrate is removed or sputtered, such problems are still unsolved that the damage of the surface of the substrate cannot completely be removed and the contaminants cannot be sufficiently removed.

Therefore, when the electrode formed by the above-described method is used for fabricating a semiconductor device, there is a problem in that characteristics of the resulting semiconductor device are not satisfactory.

DISCLOSURE OF THE INVENTION

The present invention provides a process for fabricating a semiconductor device comprising removing halogen atoms existing on a surface of a silicon layer and in a subsurface thereof so that the concentration thereof is reduced to 100 ppm or lower, and forming an electrode on the resulting silicon layer.

Further, the present invention provides a process for fabricating a semiconductor device comprising forming a gate oxide film and a gate electrode on a silicon substrate, depositing an insulating film on the resulting silicon substrate which includes the gate electrode, forming a sidewall spacer on a side wall of the gate electrode by etching back the insulating film using a halogen-containing etching gas, forming a titanium film on the resulting silicon substrate at a temperature of the substrate not higher than 500° C., removing the titanium film, and depositing a refractory metal on the resulting silicon substrate, followed by thermal treatment, to form a refractory metal silicide film in a region where the silicon substrate is in direct contact with the refractory metal.

DESCRIPTION OF THE PREFERRED EXAMPLES

The process for fabricating a semiconductor device of the present invention comprises removing halogen atoms existing on the surface of a silicon layer and the subsurface thereof so that the concentration of the halogen atoms becomes 100 ppm or lower, and forming an electrode on the resulting silicon layer.

Figure 7A:
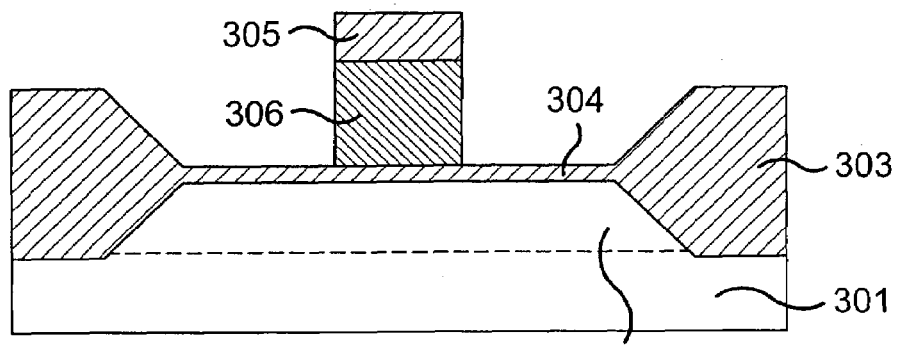
FIG. 7 is a schematic sectional view of a major part illustrating steps in a conventional process for fabricating a semiconductor device.

That is, the inventors of the present invention have made various studies on the problems of the above-discussed conventional process for forming the electrode to ascertain the following new facts:

① In FIG. 7(a) of the above-discussed conventional process for forming the electrode, when a polysilicon layer 305 (gate electrode) is patterned by the RIE method, halogen atoms in the etching gas enter into the silicon substrate by energies of ions, radicals or the like during etching, to contaminate the inside of the substrate.

Figure 7B:
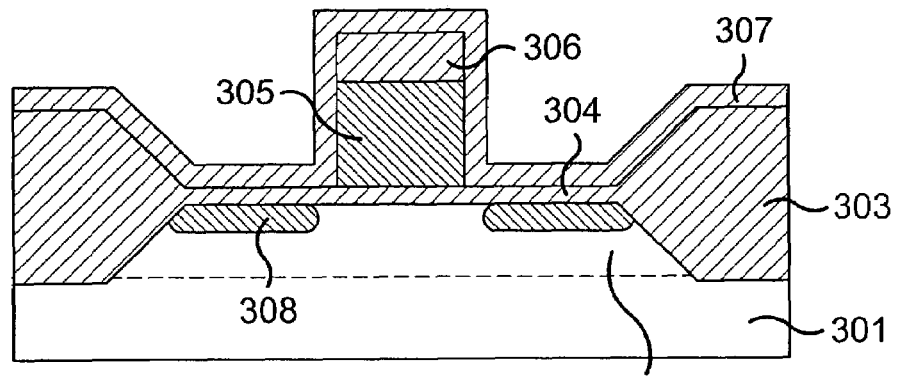
Figure 7C:
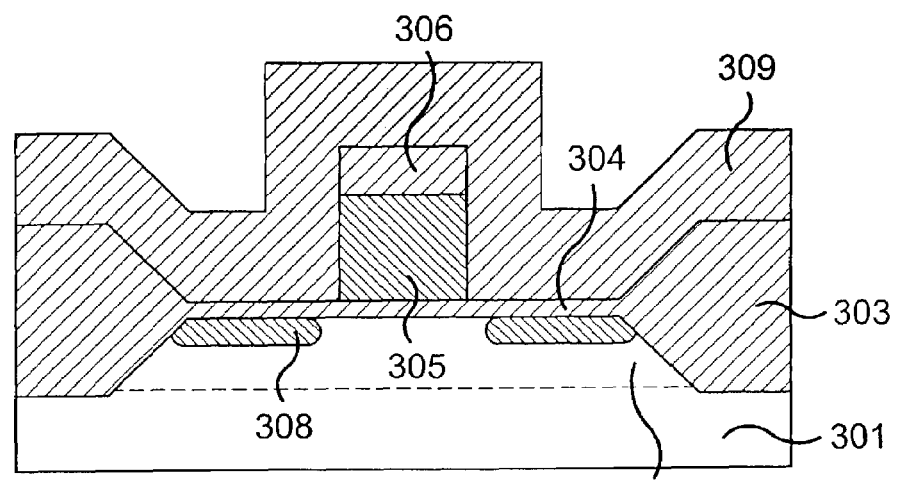

Further, in the step shown in FIG. 7(b), contaminants adhering to the surface of the protective film 307 against ion implantation are knocked on or into the silicon substrate at ion implantation, and the inside of the silicon substrate is contaminated. Especially, in the case where, as in the step shown in FIG. 7(e), the ion implantation dose is much greater than that for the LDD implantation shown in FIG. 7(b), particularly, in the case of implantation to form a source/drain region (in a dose of about $1\times10^{15}$ to $1\times10^{16}$ cm$^{-2}$), the amount of contaminants knocked on or into the silicon substrate shows an order-of-magnitude increase.

Figure 7D:
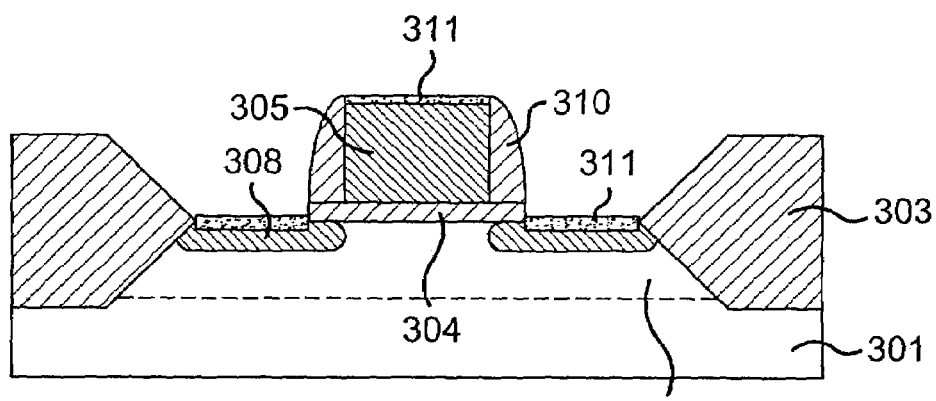
Figure 7E:
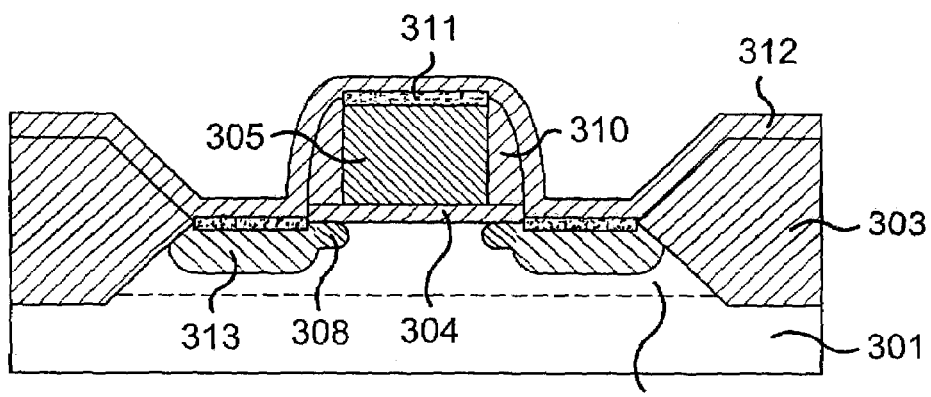
Figure 7F:
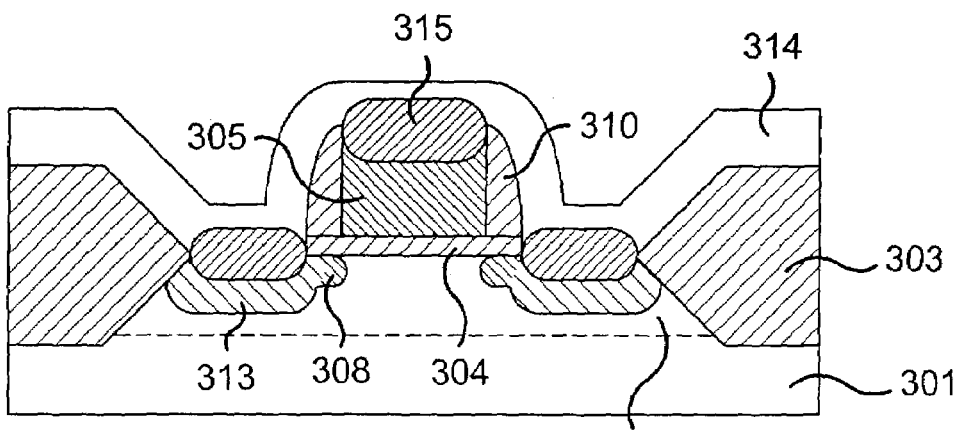
Figure 7G:
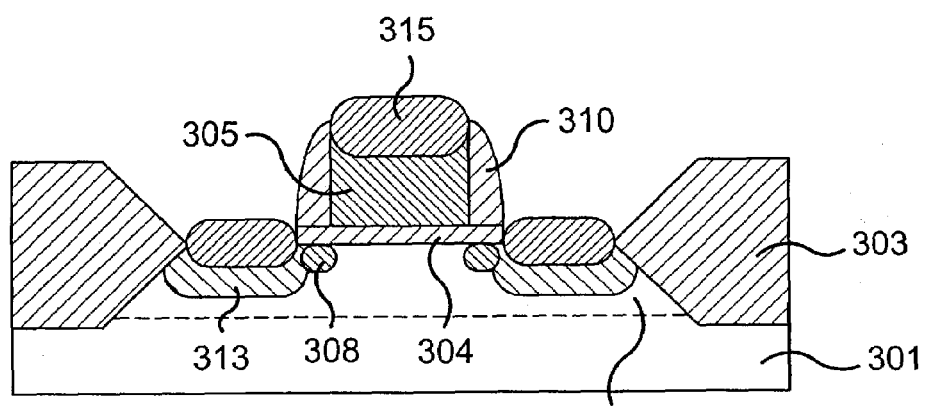

③ Still further, in FIG. 7(d), the over-etching at the formation of the sidewall spacer generates a damaged-by-etching layer 311 on the surface of the silicon substrate and also causes the migration of contaminants into the silicon substrate 301. The migration of the contaminants into the substrate is caused not only by a gas for over-etching but also by the knock-on at the ion implantation.

Moreover, if a silicide layer is formed on the silicon substrate in such a state that the contaminants such as fluorine and the like exist in the subsurface of the silicon substrate, particularly in such a state as that of the damaged-by-etching layer 311, reliability and characteristics of the silicide film are deteriorated as described later. The reason is considered to be that, if silicification is carried out in the state that halogen atoms such as fluorine and the like or halogen compounds exist in the subsurface of the silicon substrate, the resulting substrate falls in such a state that the refractory metal, silicon, an impurity which may be a donor or an acceptor, and the contaminants such as halogen atoms co-exist therein, and a number of different reactions of these substances bring about deterioration in the condition of an interface between the suicide and the silicon substrate.

⑤ Further, for example, if a titanium silicide film is formed on the silicon substrate in which the contaminants such as fluorine and the like exist, the resistance of the silicide film increases greatly. Particularly, in an interconnection layer (gate electrode) having a thickness of 0.5 μm or less, the resistance increases remarkably. The reason is that, since compounds such as Ti—F are formed to be relatively stable (for example, standard enthalpy of formation of TiF$_4$ is 394.2 kcal/mol), the reaction of titanium with silicon is inhibited and a uniform silicide film is not formed, and also that a compound of titanium and the contaminants readily segregates to a grain boundary in the titanium silicide film. Further, since an interfacial free energy between TiSi$_2$ and compounds such as Ti—F is larger than that between TiSi$_2$ and TiSi$_2$, it is more stable that TiSi$_2$ and compounds such as Ti—F are separated. Therefore, TiSi$_2$ and compounds such as Ti—F are readily separated when energy is applied from outside, and the silicide film coheres.

Further, for example, if the titanium silicide film is formed on the silicon substrate in which the contaminants such as fluorine and the like exist, junction leak current between the source/drain region and a well region increases. The reason is that, in the presence of the contaminants, salicide formation reaction does not take place uniformly and therefore the salicide film becomes an uniform film. That is, there occurs the phenomenon that the salicide film is extremely thick only in a certain region and extremely thin in another region. This is because in the region where the titanium silicide film is thin, the above-described cohesion takes place readily and the electric resistance increases, while in the region where the titanium silicide film is thick, the distance from a junction of the source/drain region and the well region to the titanium silicide film becomes shorter.

Figure 8:
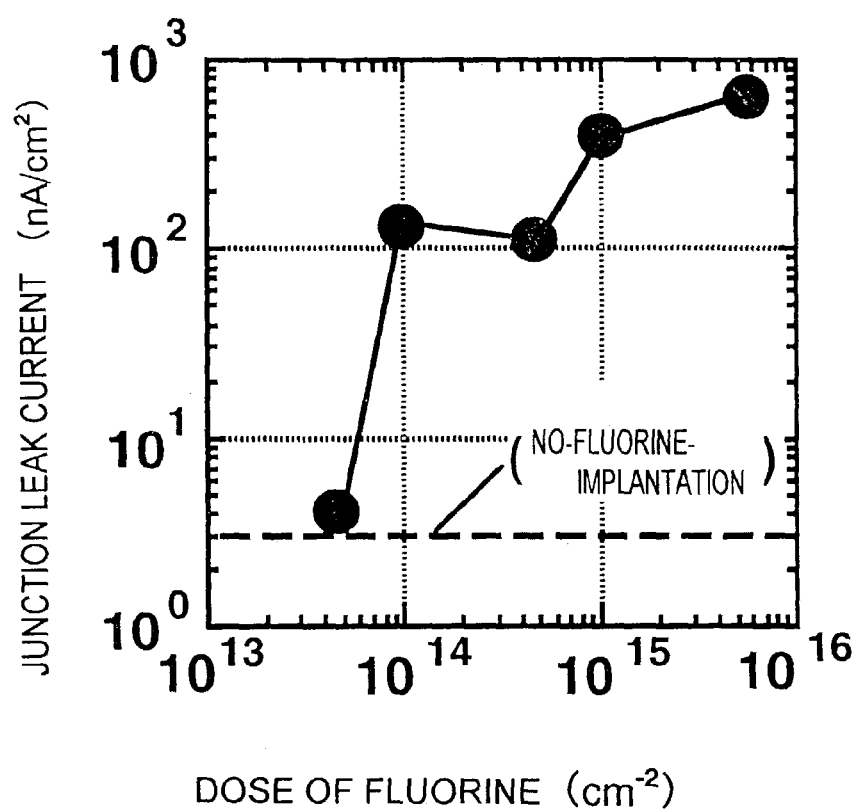
FIG. 8 is a graph illustrating relation between junction leak current and the dose of fluorine, which is a contaminant.

This is clear from the relation between junction leak current value and the contaminants (fluorine) existing on the silicon substrate shown in FIG. 8. According to FIG. 8, the junction leak current increases as the implanted dose of fluorine is increased, that is, the existence of fluorine deteriorates the junction leak, when fluorine had been implanted into an n$^+$/p junction, then a titanium silicide film was formed and the junction leak current was measured.

Therefore, considering these facts, the inventors of the present invention have found it necessary to effectively remove the contaminants existing not only on the surface of the silicon substrate but also in the subsurface of the silicon substrate as a method for solving the above-described conventional problems, and achieved the present invention.

(1) Removal of Contaminants from the Silicon Layer

In the process for fabricating a semiconductor device of the present invention, silicon layers mean layers which are mainly comprised of silicon, including both a silicon substrate itself and silicon films formed as electrodes or wires for connection on the semiconductor substrate. These silicon layers also include any layer comprised of single-crystalline silicon, polycrystalline silicon or amorphous silicon.

Further, these silicon layers may be unused, unprocessed or untreated layers before forming a semiconductor device or the like, and may also be any silicon substrate or silicon films under a process of fabricating a semiconductor device. That is, these silicon layers may be a silicon substrate or silicon layers on, in or under which a field oxide film, a gate insulating film, a gate electrode, a sidewall spacer, an interlayer insulating film, a contact hole, a wire for connection, a desired circuit such as a transistor or a capacitor and/or the like are formed.

For example, such silicon layers may include a silicon layer whose surface and subsurface are contaminated with the etching gas or the like used in the RIE method for patterning a gate electrode or for forming a sidewall spacer (for example, $CHF_3$, $CF_4$, $C_2F_6$, $C_3F_8$, $C_4F_{10}$, $CCl_2F_2$, $CCl_4$, $Cl_2$, HBr, $CBrF_3$, $SF_6$, $NF_3$, $CClF_3$ or the like), a silicon layer contaminated by etching for forming a contact hole which reaches the surface of the silicon layer through an interlayer insulating film formed on the silicon layer, a silicon layer contaminated with the etching gas for removing by etching an insulating film, a conductive film or the like formed on the surface of the silicon layer, a silicon layer contaminated more deeply in its inside by ion implantation for forming an LDD region, a source/drain region or the like on the above-mentioned contaminated silicon layer, and a silicon layer contaminated more deeply in its inside by mixing or by ion implantation for forming an amorphous layer.

The surface of a silicon layer and the subsurface thereof mean the surface of a silicon layer and the subsurface thereof in a region where an electrode is to be formed in a later step. The subsurface means an inner region of the silicon layer in proximity to the surface, to which a dopant and its accompanying contaminants are ordinarily introduced by etching, ion implantation, thermal treatment or the like performed during the process for fabricating a semiconductor device.

Halogen atoms mainly mean atoms which migrate as contaminants in the steps of cleaning, etching and forming a film during the process for fabricating a semiconductor device, including fluorine, chlorine, bromine or the like, for example.

(2) Formation and Removal of a Titanium Film

In the present invention, as an exemplary method of reducing the concentration of halogen atoms on the surface of the silicon layer or the like to 100 ppm or lower, a titanium film is first formed on the silicon layer at a temperature of the silicon layer not higher than 500° C., and then the titanium film is removed.

The titanium film may be any film as long as the atoms composing the film are mainly titanium, including not only a layer composed of 100% titanium atoms but also a film in which oxygen atoms and/or nitrogen atoms mix and titanium is contained as an oxide or a nitride thereof, depending on the way of forming the film. Among these films, a film composed substantially of 100% titanium is preferable.

The method of forming the titanium film is not particularly limited as long as the temperature of the silicon layer can be kept at or under 500° C. For example, a sputtering method, a chemical vapor deposition (CVD) method, a plating method, a vacuum deposition method, an EB method and an MEB method and the like can be used. In particular, the sputtering method is preferable because the contaminants are effectively incorporated into the titanium film by use of energy at the formation of the titanium film.

The thickness of the titanium film is not particularly limited as long as the thickness is such that the contaminants can be removed from the surface of a silicon layer and the subsurface thereof. For example, the thickness may be about 20 to 100 nm.

Additionally, if the temperature of the silicon layer is higher than 500° C. when the titanium film is formed, silicon in the silicon layer and titanium in the titanium film are silicified and therefore, a titanium silicide layer is formed on the surface and even in the inside of the silicon layer. This is not perferable because, in a later step of removing the titanium film, the silicide layer will also be removed together and a level difference will occur on the surface of the silicon layer.

The method of removing the titanium film is not particularly limited as long as the contaminants such as halogen atoms or the like are not left or migrated into the surface of a silicon layer and the subsurface thereof after the titanium film is removed. Examples of such methods include chemical etching or the like by dipping or the like using an acid or alkali solution such as a mixture solution of sulfuric acid and aqueous hydrogen peroxide, a mixture solution of hydrochloric acid and aqueous hydrogen peroxide, and a mixture solution of ammonia and aqueous hydrogen peroxide or the like. Further, treatment with a solution containing hydrofluoric acid is preferably performed after the removal of the titanium film by chemical etching or the like. This treatment with the solution containing hydrofluoric acid can completely eliminate compounds which have been generated by reaction of titanium and silicon due to the substrate temperature and energy from outside such as sputtering energy or the like.

By such a method, the contaminants can be effectively removed which would otherwise result in inhibition of silicide formation reaction, a rise in resistance and a decline in heat resistance (facilitation of cohesion) particularly in the case where an electrode will be formed with use of silicide formation reaction in a later step.

(3) Mixing of the Titanium Film with Contaminants

In the present invention, for reducing the concentration of halogen atoms existing on the surface of the silicon layer or the like to 100 ppm or lower, ion implantation may be performed after the titanium film is formed and before the titanium film is removed.

This ion implantation can facilitate the incorporation of the contaminants existing on the surface of a silicon layer and in the subsurface thereof into the titanium film with energy of the ion implantation.

Examples of ions used for this implantation include ions of Si, N, As, P, Sb, B, Ga, In and the like. Accelerating voltage in the ion implantation is about 20 to 50 keV, and a dose is about $1 \times 10^{15}$ to $1 \times 10^{16}$ $cm^{-2}$.

(4) Formation of Electrodes on the Cleaned Silicon Layer

Subsequently, in the present invention, electrodes are formed on the silicon layer whose surface and subsurface are cleaned.

The electrodes here mean those which are used as electrodes and interconnection wires, including those formed as parts of interconnection wires such as a contact plug, a barrier metal and the like. Materials for the electrodes are not particularly limited as long as they are conductive materials. Such materials include a variety of substances, for example, metals such as Al, Cu, Au, Pt, Ni and Ag, refractory metals such as Ti, Ta, W and Mo, polysilicons, silicides of refractory metals and polysilicons, and polycides of polysilicons and the silicides. Among these materials, the silicide may be preferable when used as the source, drain or gate electrode, because it can be formed in self-alignment and has a low resistance, and Al, Cu and W may be preferable when used as the interconnection wires. These conductive materials may be formed into a single-layer film or a laminated film. The thickness of the electrode at this time is not particularly limited, and for example, the electrode may be about 150 to 400 nm thick when used as the gate electrode.

The above-described electrode can be formed by a known method such as the sputtering method, CVD method, plating method or the like.

Specifically, for forming a silicide of a refractory metal, a two-step thermal treatment may be used wherein a refractory metal film is deposited to a thickness of about 10 to 50 nm on the silicon layer and the first and second thermal treatment are performed thereafter.

As for a method for thermal treatment, oven annealing and RTA can be used. Among them, the RTA method is preferable in view of controlling diffusion of impurities or the like.

In the case where the two-step thermal treatment is performed, the first thermal treatment may be performed within the temperature range of 400 to 700° C. for about 10 to 30 seconds. The second thermal treatment may be performed within the temperature range of 800 to 1000° C., preferably at about 850° C., for about 10 to 30 seconds. By such two-step thermal treatment, in the case of a titanium silicide layer, a titanium silicide layer of phase C49 can be formed by the first thermal treatment, and the titanium silicide layer of phase C49 can be turned into a titanium silicide layer of phase C54 which is stoichiometrically stable and of low resistance. Additionally, a process of ion implantation, a process of patterning or the like may be performed optionally after the first thermal treatment before the second thermal treatment.

Hereinafter, examples of the process for fabricating a semiconductor device of the present invention will be described with reference to the figures.

EXAMPLE 1

This example shows a method of cleaning a semiconductor substrate whose surface is contaminated with the contaminants, which method is a part of the process for fabricating a semiconductor device.

First, a silicon oxide film was formed on a silicon substrate and the silicon oxide film was etched back in such a manner that it is over-etched by about 20% of the thickness thereof by the RIE method using a mixture gas of $CHF_3$, $CF_4$ and Ar as etching gas to remove the silicon oxide film.

Figure 1A:
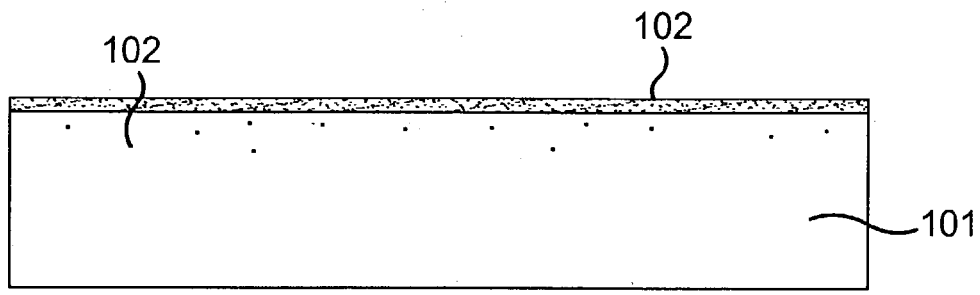
FIG. 1 is a schematic sectional view of a major part illustrating steps for removing halogen atoms existing on a surface of a silicon layer and an subsurface thereof in accordance with the process for fabricating a semiconductor device of the present invention.

Thereafter, organic substance on the surface such as carbon was removed by ashing treatment and the surface of the silicon substrate was washed by being dipped into a mixture solution of sulfuric acid and hydrogen peroxide (about 5:1 to about 10:1, at 150° C.) for about 20 to 30 minutes with adding aqueous hydrogen peroxide every five minutes. As shown in FIG. 1(a), contaminants 102 adhered on and migrated into the surface of the resulting silicon substrate 101 and the subsurface thereof.

Figure 1B:
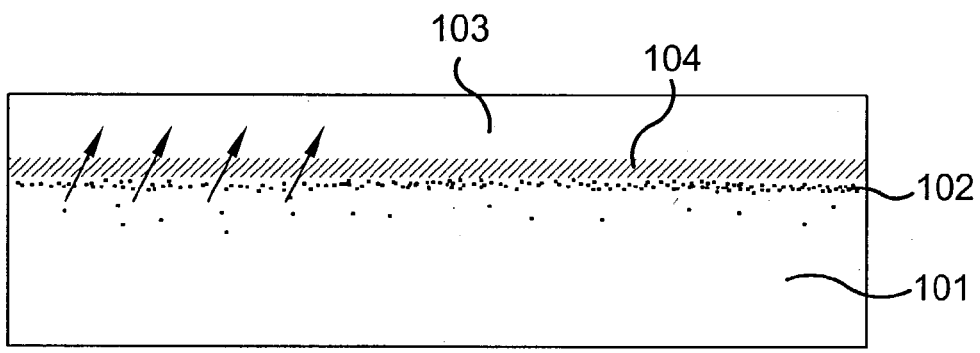

Next, as shown in FIG. 1(b), a titanium film 103 was formed to a thickness of about 30 nm on the silicon substrate 101 by the sputtering method. The substrate temperature during the formation of the titanium film 103 was 200° C.

At this time, silicon atoms and the contaminants 102 on the surface of the silicon substrate 101 and in the subsurface thereof reacted with the titanium film 103 by the sputtering energy and incorporated into the titanium film.

That is, by reacting silicon atoms on the surface with the titanium film 103, the persistent contaminants 102 existing on the surface of the silicon substrate 101 and the contaminants 102 existing in the subsurface of the silicon substrate, which cannot be removed by ordinary washing with an acid or alkali solution, can be incorporated into the titanium film 103 which includes a titanium silicide film 104 formed by this reaction.

When the substrate has a relatively low temperature of 500° C. or lower, the reaction of silicon atoms on the surface of the silicon substrate 101 with the titanium film 103 is minimized so that the surface of the silicon substrate 101 is not roughened.

Figure 1C:
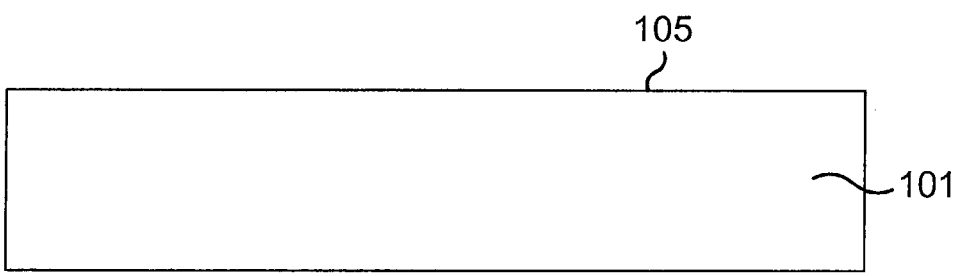
Figure 2A:
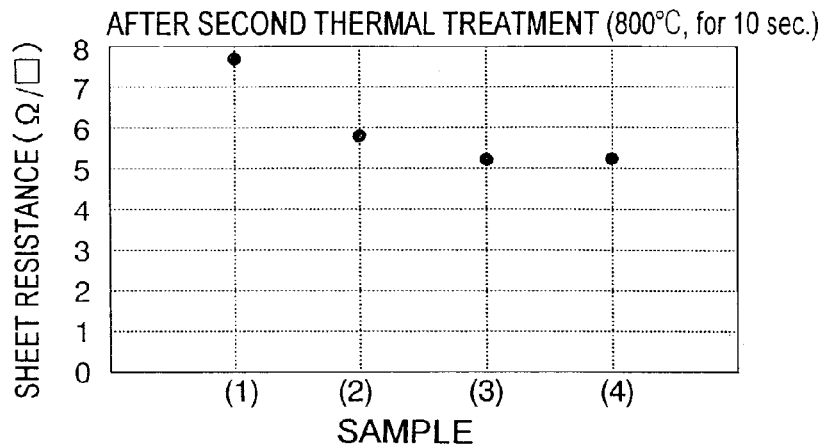
FIG. 2 is a graph illustrating relation between sheet resistance and the temperature of a second thermal treatment of a refractory metal silicide film which is formed in accordance with the process for fabricating a semiconductor device of the present invention.
Figure 2B:
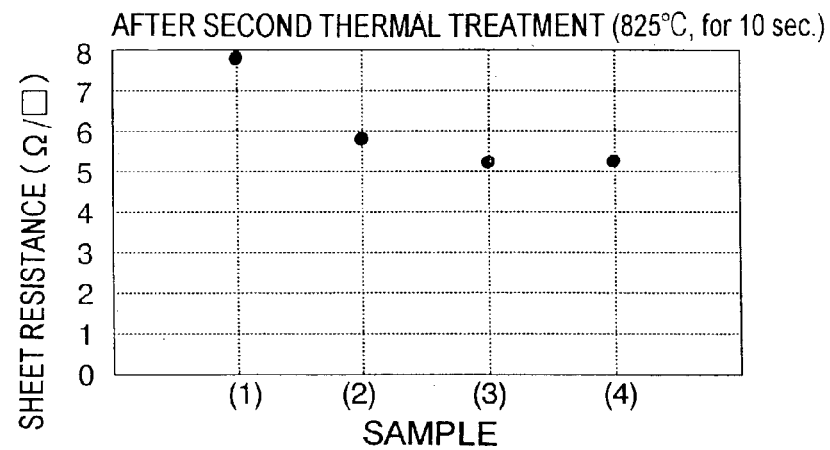
Figure 2C:
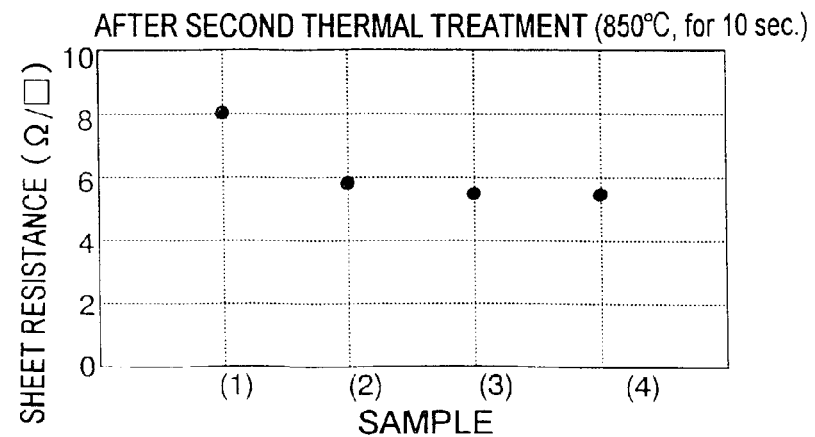
Figure 2D:
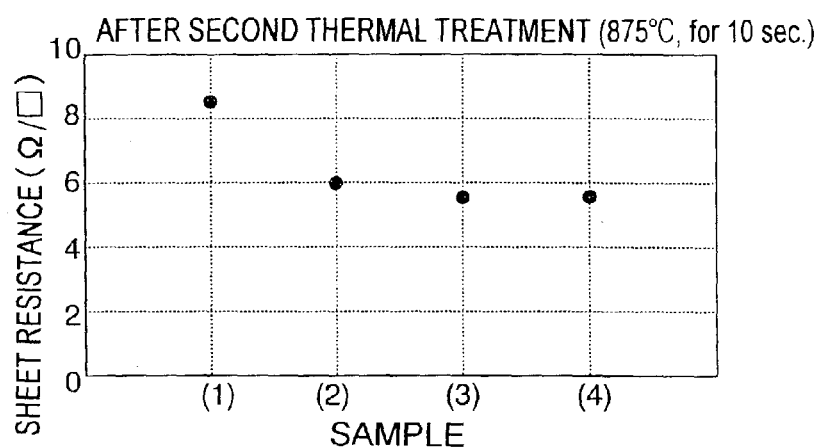
Figure 2E:
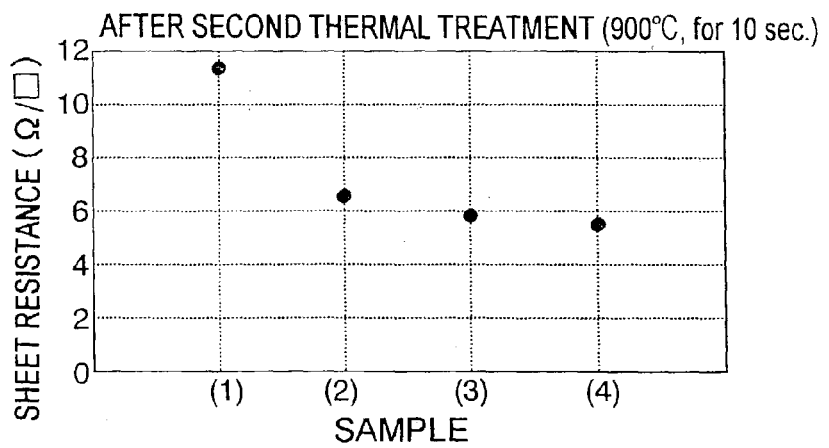

Subsequently, as shown in FIG. 1(c), the titanium film 103 into which the contaminants were incorporated was removed by chemical etching by being dipping in a mixture solution of sulfuric acid and hydrogen peroxide (about 5:1 to about 10:1, at 150° C.) and a mixture solution of aqueous ammonia and hydrogen peroxide ($NH_4OH:H_2O_2:H_2O$=about 1:1:8). Then, the titanium silicide film 104 left on the surface of the silicon substrate 101 which was a product by the reaction of the titanium film 103 with silicon atoms was removed by chemical etching by being dipped in a 0.5% aqueous hydrofluoric acid solution at room temperature for about 30 to 45 seconds.

Atoms on the surface of the silicon substrate 101 are identified in each of the above-described steps by X-ray photoelectron spectroscopy (XPS). The result is shown in Table 1.

TABLE 1

| | | (atom %) |
| --- | --- | --- |
| | F | Ti |
| just after the RIE treatment | 5.0 | not detected |
| after the RIE treatment and washing with $H_2SO_4 + H_2O_2$ | 0.35 | not detected |
| after the RIE treatment, washing with $H_2SO_4 + H_2O_2$ and formation and removal of the titanium film (at a substrate temperature of 200° C.) | 0.05 | not detected |
| after the RIE treatment, washing with $H_2SO_4 + H_2O_2$ and formation and removal of the titanium film (at a substrate temperature of 440° C.) | not detected (100 ppm or lower) | not detected |

1 atom % = 10000 ppm

As is apparent from the Table 1, a large quantity of fluorine atoms, which were contaminants derived from the etching gas, were detected just after the RIE treatment. This table also shows that fluorine atoms were not completely removed after ordinary washing with a mixture solution of sulfuric acid and hydrogen peroxide after the RIE treatment, though fluorine atoms decreased to some extent.

On the other hand, after the titanium film was sputtered at a substrate temperature of 200° C. and then removed, as described above, fluorine atoms were reduced more. In the case where the substrate temperature was set relatively higher, 440° C. for sputtering the titanium film, it was found that, after the removal of the titanium film, fluorine atoms were completely removed and that fluorine atoms was reduced below a detection limit.

By the above-mentioned example, the silicon substrate 101 whose surface 105 was clean and scarcely damaged was obtained.

In other words, according to the above-mentioned example, since the contaminants 102 mainly on the surface and in the subsurface are reacted with the titanium film 103 and then the titanium film 103 is removed, the contaminants 102 can be removed with the titanium film 103, so that the surface of the silicon substrate 101 and the subsurface thereof can be cleaned. Additionally, since thermal treatment to react the titanium film 103 with silicon atoms is not performed, in particular, the surface of the silicon substrate 101 is not damaged during the process.

EXAMPLE 2

This example shows heat resisting characteristics of a titanium silicide film in the case where the titanium silicide film is formed as an electrode on a silicon layer after the surface of the silicon layer and the subsurface thereof are cleaned.

First, a p-well region, a field oxide film, a gate oxide film and the like were formed on the silicon substrate, a polysilicon was deposited to have a thickness of about 150 to 200 nm on the resulting silicon substrate, then a gate electrode was formed using a mixture gas of HBr, $Cl_2$ and $O_2$ as etching gas, and then an LDD region was formed by ion implantation using a protective film against ion implantation (a film of silicon oxide having a thickness of about 10 to 40 nm). This implantation of impurity ions was performed, for example, at an accelerating voltage of 20 keV in a dose of about $1 \times 10^{13}$ to $3 \times 10^{14}$ $cm^{-2}$ for forming an N-type channel transistor.

Subsequently, a silicon oxide film was formed on the entire surface of the resulting silicon substrate and the silicon oxide film was etched back to be over-etched about 20% by the RIE method using a mixture gas of $CHF_3$, $CF_4$ and Ar to form a sidewall spacer on a side wall of the gate electrode.

Successively, ion implantation was performed again to form a source/drain region using a protective film against ion implantation of a silicon oxide film. In this ion implantation, arsenic ions were implanted at an accelerating voltage of about 30 to 60 keV in a dose of about $1 \times 10^{15}$ to $5 \times 10^{15}$ $cm^{-2}$, for example, for forming an N-type channel transistor.

Then, the surface of the resulting silicon substrate was washed by being dipped into a mixture solution of sulfuric acid and aqueous hydrogen peroxide at 150° C. These steps can be performed in accordance with a known method, for example, the method illustrated in FIG. 7(a) to FIG. 7(e).

Next, a titanium film was deposited on the resulting silicon substrate to a thickness of 30 nm at a substrate temperature of 200° C. or 440° C. in the same manner as in Example 1, and then the titanium film was removed by chemical etching by being dipped in a mixture solution of sulfuric acid and hydrogen peroxide (about 5:1 to about 10:1, at 150° C.) for about 10 minutes. Subsequently, the titanium silicide film which has been left on the surface of the silicon substrate was removed by chemical etching by being dipped in a 0.5% aqueous hydrofluoric acid solution for about 30 to 45 seconds.

Then, a titanium film having a thickness of about 30 nm was deposited on the resulting silicon substrate, and silicon ions are implanted at an accelerating voltage of about 40 keV in a dose of $5 \times 10^{15}$ $cm^{-2}$, for example, for facilitating homogeneous reaction of silicon with titanium.

Subsequently, the first thermal treatment was performed at about 625° C. for about 10 seconds, an unreacted titanium film was removed by wet etching using a mixture solution of sulfuric acid and hydrogen peroxide (about 5:1 to about 10:1, at 150° C.) and a mixture solution of aqueous ammonia and hydrogen peroxide ($NH_4OH:H_2O_2:H_2O=1:1:8$), and then the second thermal treatment was performed for about 10 seconds at different temperatures between about 800 to 900° C.

The sheet resistance of the obtained titanium silicide is shown in FIG. 2(a) to FIG. 2(e).

In FIG. 2(a) to FIG. 2(e), sample (2) denotes the case where the titanium film used for cleaning was formed at a substrate temperature of 200° C., and sample (3) denotes the case where the titanium silicide was formed at a substrate temperature of 440° C. For comparison, sample (1) denotes the case where the silicon substrate was subjected to cleaning with the mixture solution of sulfuric acid and hydrogen peroxide but the titanium film was not formed and removed, and sample (4) denotes the case where the titanium silicide film was formed on a clean silicon substrate which had not been subjected to RIE etching.

As is clear from FIG. 2(a) to FIG. 2(e), samples (2) and (3) had almost as low a sheet resistance as sample (4) even though the temperature of the second RTA treatment was high. This resulted from the fact that the surface of the substrate was cleaned by the steps of forming and removing of the titanium film.

Further, it has been ascertained that higher temperature for forming the titanium film is more effective, but that the substrate temperature is preferably within the range of 200 to 500° C.

EXAMPLE 3

This example shows variation in sheet resistance with respect to gate length in the case where the titanium silicide film was formed as a gate electrode on a silicon layer whose surface and subsurface have been cleaned.

The gate electrodes of this example were formed in the same manner as in Example 2 except that the titanium film was formed at a substrate temperature of 440° C. and the second thermal treatment was performed at 850° C. The gate electrodes were formed to have a gate length within the range of 0.1 to 0.7 μm.

Figure 3:
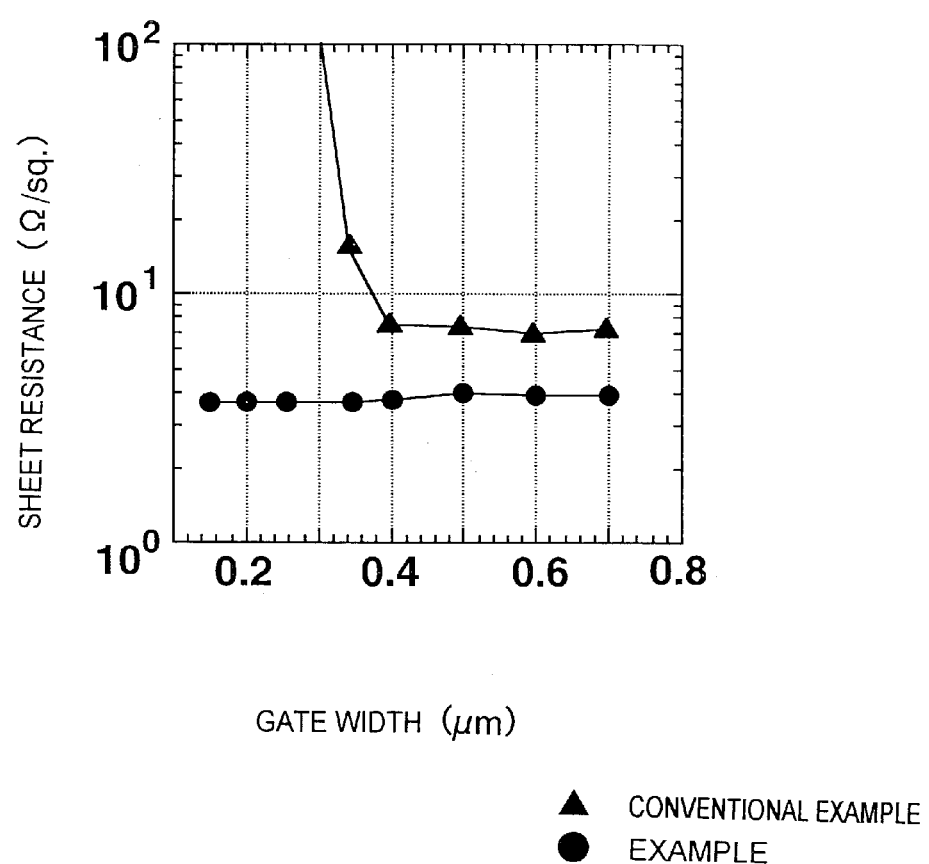
FIG. 3 is a graph illustrating relation between sheet resistance and width of a gate electrode of a refractory metal silicide film, that is, gate length of a transistor, which is formed in accordance with the process for fabricating a semiconductor device of the present invention.

The sheet resistance of each gate electrode is represented by (●) in FIG. 3. For comparison, gate electrodes were formed in the same manner as in this example except that the formation and removal of the titanium film were not performed, and the sheet resistance of each gate electrode was also measured. The results are represented by (▲).

In the case where the formation and removal of the titanium film were carried out as in this example, the sheet resistance of the gate electrodes formed thereafter was scarcely increased even if the gate length was reduced to as small as 0.1 μm.

On the other hand, in the case where the gate electrodes were formed in the same manner as in a conventional method wherein the formation and removal of the titanium film were not carried out, the sheet resistance was drastically increased, especially in a fine wire gate having a width of 0.5 μm or smaller.

EXAMPLE 4

This example shows an example wherein the method of Example 1 is applied to a salicide technique (self-aligned source, drain, gate silicide formation technique).

Figure 4A:
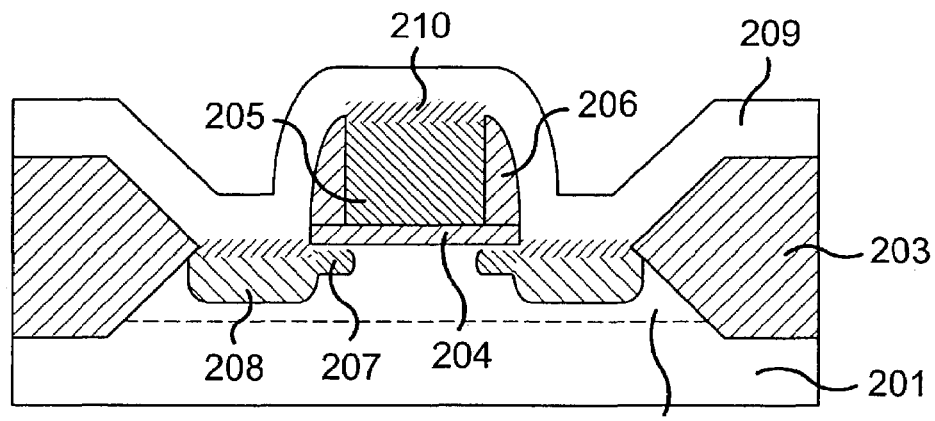
FIG. 4 is a schematic sectional view of a major part illustrating steps in an example in accordance with the process for fabricating a semiconductor device of the present invention.

First, as shown in FIG. 4(a), according to a known method, for example, a method along FIG. 7(a) to FIG. 7(e), a gate oxide film 204 was formed on a silicon substrate 201 having a device isolation film 203 and a well region 202 thereon, a polysilicon was deposited on the resulting silicon substrate 201, a gate electrode 205 was formed using a mixture gas of HBr, $Cl_2$ and $O_2$ as etching gas, and ion implantation was performed using a protective film against ion implantation (not shown) to form an LDD region 207.

Subsequently, a silicon oxide film having a thickness of about 100 to 200 nm was formed on the resulting silicon substrate 201, and the silicon oxide film was etched back by the RIE method using a mixture gas of $CHF_3$, $CF_4$ and Ar as etching gas so as to be over-etched about 20%, thereby to form a sidewall spacer 206 on a side wall of the gate electrode.

Then, ion implantation was again performed using a protective film against ion implantation of silicon oxide (not shown) to form a source/drain region 208. Then, the protective film against ion implantation was removed.

Next, a titanium film 209 was formed to a thickness of 30 nm on the silicon substrate 201 by the sputtering method at a substrate temperature of 440° C.

At this time, as described in Example 1, contaminants on the surface of the silicon substrate 201 was reacted with the deposited titanium film 209 and were incorporated into the titanium film 209, or the contaminants were incorporated into a titanium silicide film 210 formed by energy at the sputtering.

Figure 4B:
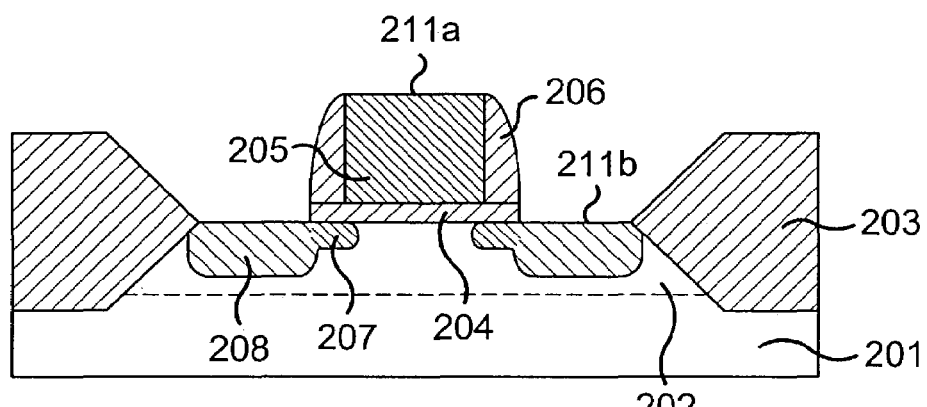

Subsequently, as shown in FIG. 4(b), the titanium film 209 containing the contaminants was removed by chemical etching using a mixture solution of sulfuric acid and hydrogen peroxide (about 5:1 to 10:1, at 150° C.), then the titanium silicide film 210 which remains on the surface of the silicon substrate 201 and contains products by the reaction of titanium with the contaminants was removed by chemical etching by being dipped in a 0.5% solution of hydrofluoric acid.

Thus, clean surfaces 211a and 211b were obtained on the gate electrode 205 and the source/drain region 208.

At the removal of the titanium silicide film 210, etching time was set to within 90 seconds in order to protect the sidewall spacer 206 formed previously. Since titanium deposited on the surface was also be able to be removed completely by this chemical etching, the contamination of the surface of the silicon substrate 201 and the gate electrode 205 with titanium is eliminated. In addition, there was no possibility that devices which were to be used in later steps would be contaminated by remaining titanium.

Figure 4C:
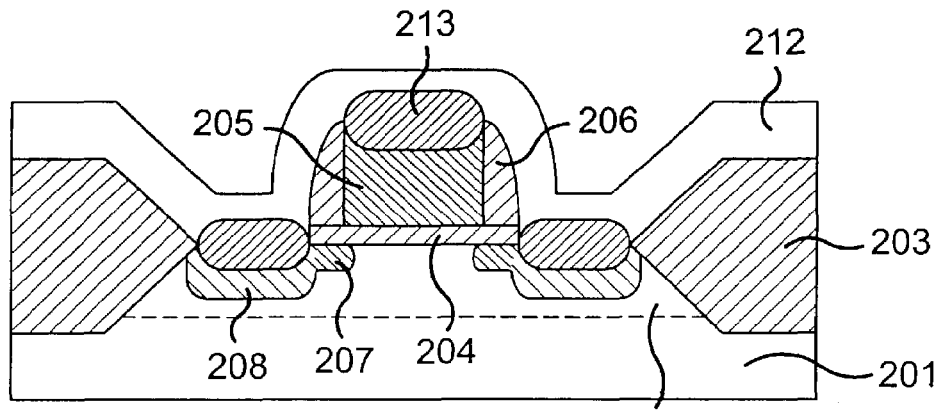

Then, as shown in FIG. 4(c), a titanium film 212 of about 30 nm thickness was deposited on the resulting silicon substrate 201, and silicon ions were implanted at an accelerating voltage of 40 keV in a dose of $5\times10^{15}$ $cm^{-2}$ so as to agitate the interfaces of titanium and silicon in view of promoting homogeneous reaction of silicon and titanium.

Next, a titanium silicide layer 213 of phase C49 was formed by, reacting titanium with silicon by the first thermal treatment at about 625° C. for about 10 seconds. At this time, in a region where silicon and the titanium film were in contact with each other, silicide formation reaction occurred and the titanium suicide film was formed. On the other hand, in a region where the silicon oxide film and the titanium film were in contact with each other, the silicide formation reaction was inhibited and the titanium silicide film was not formed. Accordingly, subsequently, an unreacted titanium film 212 was removed by wet etching using a mixture solution of sulfuric acid and aqueous hydrogen peroxide. Then, the second thermal treatment was performed at about 875° C. for about 10 seconds to turn the titanium silicide layer 213 of phase C49 into the titanium silicide layer of phase C54 having a lower resistance.

By such a process, the titanium silicide film 213 was formed on the source/drain region 208 and on the gate electrode 205 in a self-alignment.

In this example, the contaminants on the surface of the silicon substrate 201 and the gate electrode 205 were removed by setting the temperature of the substrate to 500° C. or lower when the titanium film 209 was formed.

In the case where the substrate temperature is set to 500° C. or higher, for example, 700° C., when the titanium film is formed, titanium is reacted with the silicon substrate 201 and the gate electrode 205 beyond the interfaces and a crystalline suicide is produced.

Figure 5A:
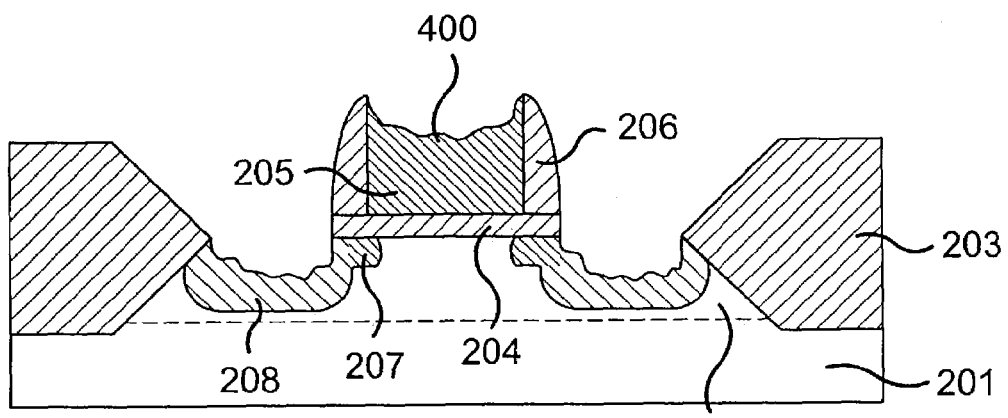
FIG. 5 is a schematic sectional view of a major part illustrating the state of a surface of a silicon layer, in the case where a titanium film is formed at a temperature of the substrate of 500° C. or higher in accordance with the process for fabricating a semiconductor device of the present invention.

Therefore, at the removal of the titanium film 209 and the titanium suicide film 213 containing the contaminants, the crystalline silicide is etched away simultaneously and level difference 400 appears on the surfaces of the silicon substrate 201 and the gate electrode 205 as shown in FIG. 5(a). Moreover, since titanium is reacted with silicon in a reaction system containing the contaminants, the silicification reaction does not take place homogeneously as described above. It causes more remarkable level difference 400 on the surfaces of the silicon substrate 201 and the gate electrode 205, and flat surfaces cannot be obtained.

Figure 5B:
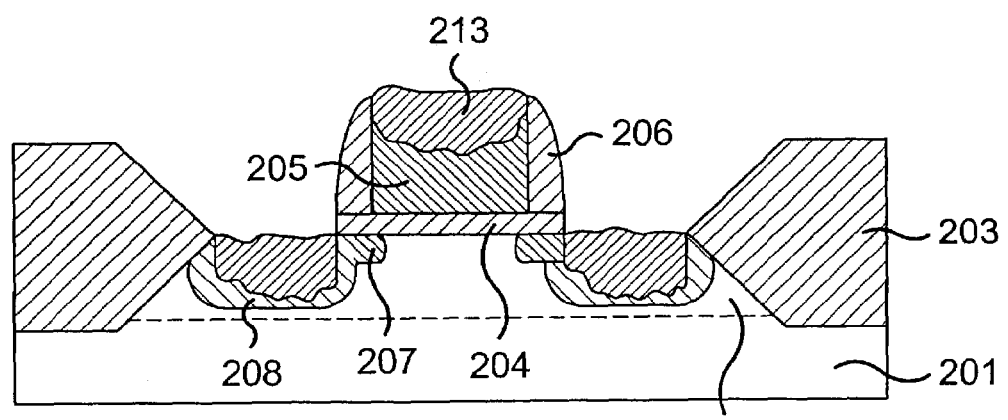

Moreover, if the titanium silicide film 213 is formed on the silicon substrate 201 and the gate electrode 205 which have the level difference 400 formed thereon, a uniform titanium silicide film 213 is not obtained as shown in FIG. 5(b) and heat resistance degrades, which results in a higher resistance of the titanium silicide film 213. Additionally, since the interface between the finally obtained titanium silicide film 213 and silicon substrate 201 is in a deeper position, the junction of the source/drain region 208 with the well region 202 comes closer to the titanium silicide film 213, which leads to an increase of junction leak current. For preventing this, a shallow junction cannot be formed on the surface of the silicon substrate 201. Therefore, miniaturization of MOSFET will be difficult.

On the other hand, it is ascertained that when the substrate temperature was 500° C. or lower, the contaminants were reacted sufficiently with the titanium film 209 and incorporated into the titanium film 209, and that the surfaces of the silicon substrate 201 and the gate electrode 205 were cleaned.

In this example, though the formation and removal of the titanium film was carried out after the formation of the source/drain region, the formation and removal of the titanium film may be carried out after the formation of the sidewall spacer and before the formation of the source/drain region.

EXAMPLE 5

This example shows an example of removing the contaminants still more positively by ion implantation.

In the same manner as in Example 4, mainly, a gate electrode and a sidewall spacer were formed and a titanium film was formed by the sputtering method to a thickness of 30 nm on a silicon substrate. Thereafter, silicon ions were implanted into the silicon substrate and the gate electrode at an accelerating voltage of about 20 to 50 keV in a dose of about $1\times10^{15}$ to $1\times10^{16}$ cm$^{-2}$ through the resulting titanium film.

By this ion implantation, the mixing of the titanium film and the contaminants was able to be promoted.

After then, the removal of the titanium film, the formation of the titanium silicide and the like were carried out in the same manner as in Example 4 to complete a semiconductor device.

As described above, since the ion implantation after the formation of the titanium film and before the removal of the titanium film can mix the titanium film and the contaminants, the contaminants existing in the subsurface of the silicon substrate can be effectively incorporated into the titanium film by ion implantation energy. Therefore, the removal of the contaminants is reliably done by removing the titanium film and the titanium silicide film.

EXAMPLE 6

This example shows an example wherein the method of Example 1 is applied to a process for forming a contact.

First, similarly to Example 4, a gate oxide film 304, a gate electrode 305 and a sidewall 310 were formed on a silicon substrate 301 having a device isolation film 303 and a well region 302, then a source/drain region 313 having an LDD region 308 was formed in the subsurface of the silicon substrate 301.

Figure 6A:
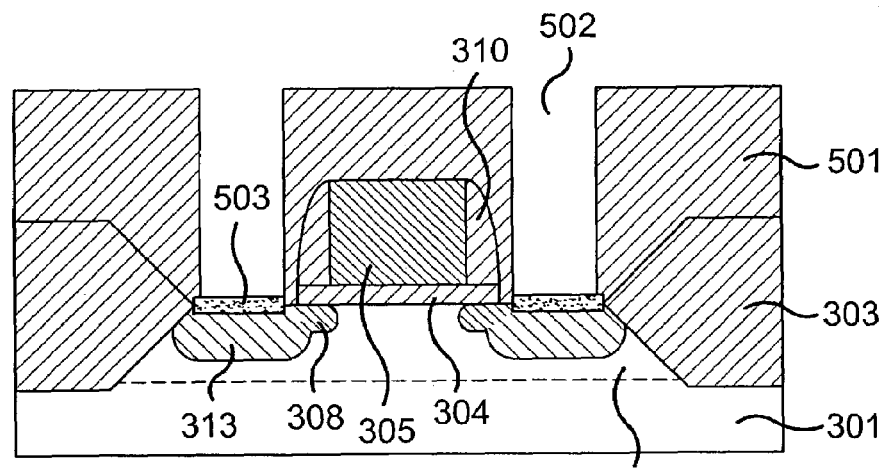
FIG. 6 is a schematic sectional view of a major part illustrating steps in another example in accordance with the process for fabricating a semiconductor device of the present invention.

Then, as shown in FIG. 6(a), an interlayer insulating film 501 having a thickness of about 400 nm was formed on the resulting silicon substrate 301, and a contact hole 502 was opened in the interlayer insulating film 501 on the source/drain region 313 by the RIE method using a photoresist mask having a desired configuration (not shown) and $C_4F_8$ or the like as an etching gas.

At this time, the surface 503 of the silicon substrate 301 at the bottom of the contact hole was contaminated by halogen atoms contained in the etching gas.

Figure 6B:
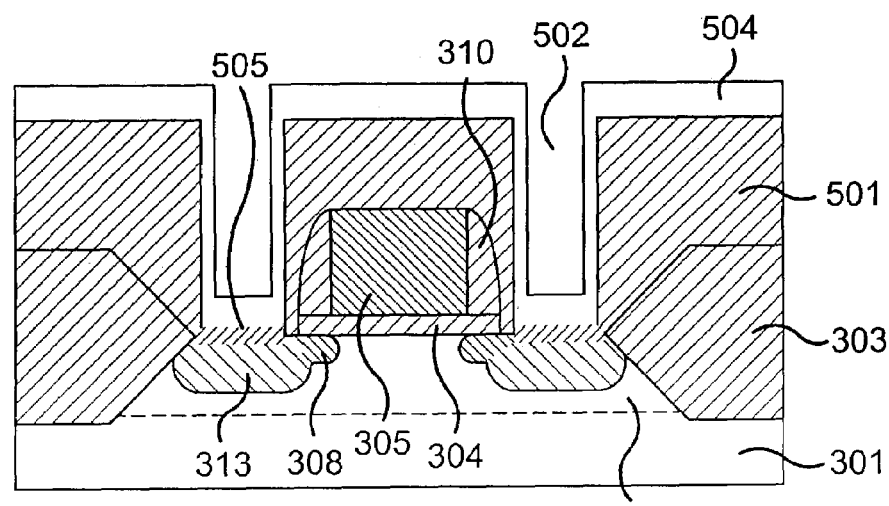

Next, as shown in FIG. 6(b), a titanium film 504 having a thickness of about 30 nm was deposited on the entire surface of the silicon substrate 301 including the contact hole 502 by the sputtering method at 440° C.

At this time, as shown in Example 1, the contaminants on the surface 503 of the silicon substrate 301 at the bottom of the contact hole 502 reacted with the deposited titanium film 504 and was incorporated into the titanium film 504 and a titanium suicide film 505 formed by energy at the sputtering.

Subsequently, the titanium film 504 and the titanium silicide film 505 containing the contaminants were removed in the same manner as in Example 1.

Figure 6C:
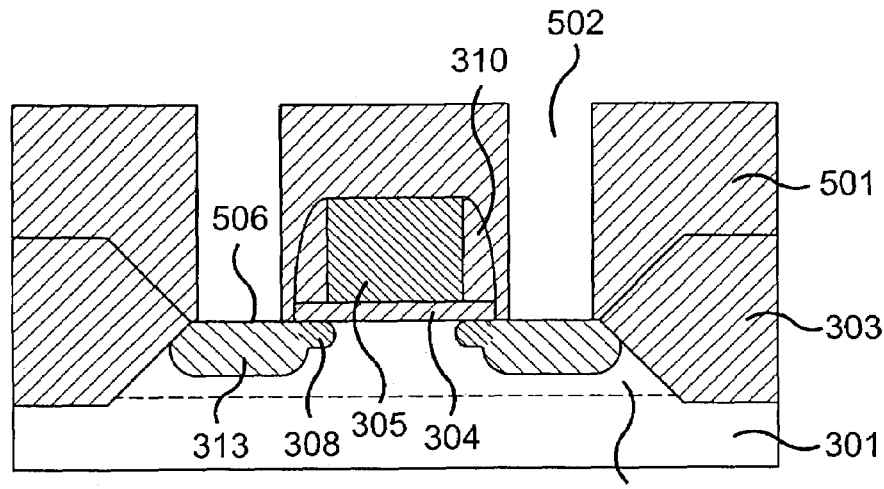

Thus, as shown in FIG. 6(c), a clean surface 506 of the silicon substrate 301 was obtained.

Figure 6D:
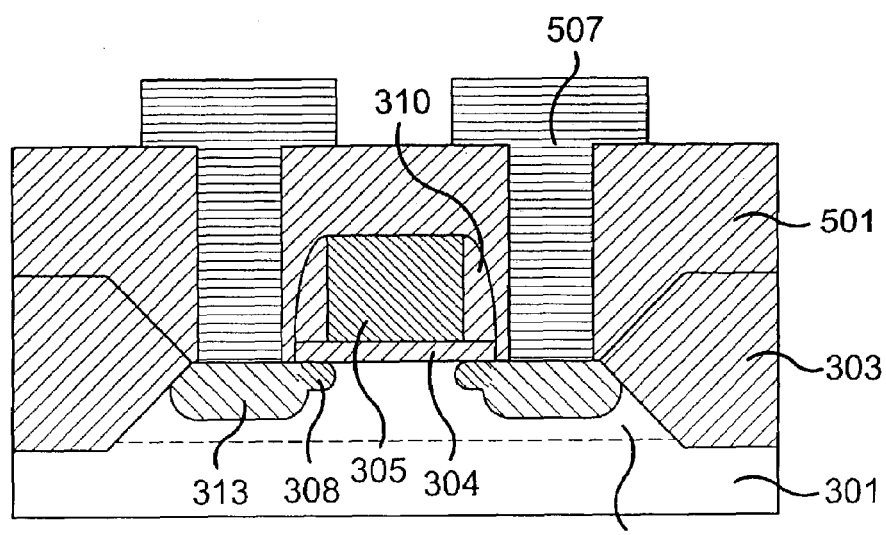

Thereafter, as shown in FIG. 6(d), a titanium film (not shown) was deposited to a thickness of about 50 to 100 nm in the contact hole by a known method, followed by thermal treatment under nitrogen atmosphere to allow silicon and titanium to react with each other at the bottom of the contact hole 502 and simultaneously form titanium nitride on the surface of the titanium film to produce a barrier metal (not shown). Subsequently, a metal for interconnection was embedded in the contact hole 502 and patterned to form a metal interconnection 507.

Thus, according to this example, also in the case where the silicide film is not formed on the surfaces of the gate electrode and the source/drain region, the bottom of the contact hole which is contaminated by the etching gas for opening the contact hole can be cleaned.

Accordingly, as a result of the cleaning of the metal-silicon interface at the bottom of the contact hole, the resistance of the contact can be reduced. An ohmic property of the contact hole is deteriorated by a slight contamination as an opening area of the contact and a contact area of the source/drain region with the metal interconnection become smaller. However, the method of this example is more effective especially as the opening area of the contact becomes smaller.

As described above, according to the present invention, the concentration of halogen atoms on existing the surface of the silicon layer and in the subsurface thereof is reduced to 100 ppm or lower. Thus, in the case where an electrode is formed on the resulting silicon layer, the heat resistance of the obtained electrode can be improved and the resistance of the electrode can be reduced.

Particularly, when the method for reducing the concentration of halogen atoms existing on the surface of the silicon substrate and in the subsurface thereof to 100 ppm or lower comprises forming a titanium film at a temperature of the silicon layer of 500° C. or lower and removing the titanium film, the contaminants adhering to the surface of the silicon layer and the subsurface thereof can be incorporated into the titanium film with use of the readiness of titanium to react with other substances (high reducing ability). By the removal of the titanium film, the contaminants which would otherwise produce problems in later steps are reliably removed and, the surface of the silicon layer and the subsurface thereof can be cleaned.

Accordingly, in the case where an electrode or the like is formed on the silicon layer, a contact having a greater ohmic property can be formed at the interface between the electrode and the silicon layer.

Besides, the titanium film is formed under the condition of a moderate temperature of the silicon layer of 500° C. or lower, damage to the surface of the silicon layer can be prevented to the utmost when the titanium film is removed. Consequently, when an electrode is formed on the silicon layer in a later step, it is possible not only to prevent deterioration of an ohmic contact which would result from the damage of the surface of the silicon layer, but also to improve the uniformity of the film of the electrode and the resistance and heat resistance of the electrode, and further, to prevent the leak current.

Moreover, for such a method, steps which are ordinarily used in the usual process for fabricating MOS semiconductor devices can be used as they are. Therefore, this method can be realized without need to develop a new manufacturing technique or equipment.

What is claimed is:

1. A process for fabricating a semiconductor device comprising:
providing a surface of a silicon layer having halogen atoms as contaminants; and
a step of reducing a concentration of the halogen atoms on the surface of the silicon layer and in a subsurface thereof,
wherein the step includes forming a titanium film directly on the silicon layer and removing the titanium film formed on the silicon layer so that the concentration of halogen is reduced to 100 ppm or lower.

2. The process for fabricating a semiconductor device as set forth in claim 1, wherein the titanium film is formed by a sputtering method.

3. The process for fabricating a semiconductor device as set forth in claim 1, wherein the titanium film is removed by chemical etching.

4. The process for fabricating a semiconductor device as set forth in claim 1, wherein the halogen is F, Cl or Br.

5. The process for fabricating a semiconductor device as set forth in claim 1, wherein the titanium film is substantially 100% titanium.

6. The process for fabricating a semiconductor device as set forth in claim 1, wherein the temperature of the silicon layer is kept at or under 500° C.

7. The process for fabricating a semiconductor device as set forth in claim 1, wherein the thickness of the silicon layer is about 20 to 100 nm.

8. The process for fabricating a semiconductor device as set forth in claim 3, wherein the chemical etching is performed using a mixture of sulfuric acid and aqueous hydrogen peroxide, a mixture of hydrochloric acid and aqueous hydrogen peroxide or a mixture of ammonia and aqueous hydrogen peroxide.

9. A process for fabricating a semiconductor device comprising:
   providing a surface of a silicon layer having halogen atoms as contaminants; and
   a step of reducing a concentration of the halogen atoms on the surface of the silicon layer and in a subsurface thereof,
   wherein the step includes forming a titanium film on the silicon layer and completely removing the titanium film so that the concentration of halogen is reduced to 100 ppm or lower.

10. The process for fabricating a semiconductor device as set forth in claim 9, wherein the titanium film is formed by a sputtering method.

11. The process for fabricating a semiconductor device as set forth in claim 9, wherein the titanium film is removed by chemical etching.

12. The process for fabricating a semiconductor device as set forth in claim 9, wherein the halogen is F, Cl or Br.

13. The process for fabricating a semiconductor device as set forth in claim 9, wherein the titanium film is substantially 100% titanium.

14. The process for fabricating a semiconductor device as set forth in claim 9, wherein the temperature of the silicon layer is kept at or under 500° C.

15. The process for fabricating a semiconductor device as set forth in claim 9, wherein the thickness of the silicon layer is about 20 to 100 nm.

\* \* \* \* \*